(12) United States Patent
Janakiraman et al.

(10) Patent No.: US 8,766,839 B2
(45) Date of Patent: Jul. 1, 2014

(54) REDUCING THE EFFECT OF ELEMENTS MISMATCH IN A SAR ADC

(75) Inventors: Seetharaman Janakiraman, Bangalore (IN); Minkle Eldho Paul, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/607,132

(22) Filed: Sep. 7, 2012

(65) Prior Publication Data
US 2014/0070968 A1  Mar. 13, 2014

(51) Int. Cl.
*H03M 1/66* (2006.01)

(52) U.S. Cl.
USPC .......................................... 341/150; 341/161

(58) Field of Classification Search
USPC ......... 341/150, 155, 156, 158, 172, 161, 162, 341/110
See application file for complete search history.

(56) References Cited

U.S. PATENT DOCUMENTS

| | | | |
|---|---|---|---|
| 6,894,627 B2 | 5/2005 | Janakiraman et al. | |
| 6,958,722 B1 * | 10/2005 | Janakiraman et al. | 341/161 |
| 7,741,981 B1 * | 6/2010 | Wan et al. | 341/110 |
| 2005/0057387 A1 | 3/2005 | Janakiraman et al. | |
| 2009/0073018 A1 | 3/2009 | Mitikiri | |
| 2009/0102694 A1 | 4/2009 | Nittala et al. | |
| 2010/0156684 A1 | 6/2010 | Westwick et al. | |
| 2012/0218137 A1 | 8/2012 | Yoon et al. | |

FOREIGN PATENT DOCUMENTS

WO  WO 2011-149428  12/2011

OTHER PUBLICATIONS

"An Nth Order Central Symmetrical Layout Pattern for Nonlinear Gradients Cancellation," IEEE International Symposium on Circuits and Systems (ISCAS), May 23-26, 2005, IEEE Conference Publication, pp. 4835-4838.

* cited by examiner

*Primary Examiner* — Joseph Lauture
(74) *Attorney, Agent, or Firm* — Alan A. R. Cooper; Frederick J. Telecky, Jr.

(57) ABSTRACT

An intermediate set of bits of a SAR ADC are converted into first intermediate analog value and a second intermediate analog value respectively from a first set of representative capacitor and a second set of representative capacitor. A capacitor in the first set and second set are selected as not same. A SAR ADC output code is generated from the first intermediate analog value and the second intermediate analog value. The resolution of a N bit SAR ADC can be enhanced by generating more than one N bits digital codes correspondingly operating the N Bit SAR ADC with more than on transfer functions. Each transfer function is selected such that they are offset by a fraction of LSB value. The more than one N bits digital codes are then added to form P bits digital code such that P is greater than N due to addition.

17 Claims, 18 Drawing Sheets

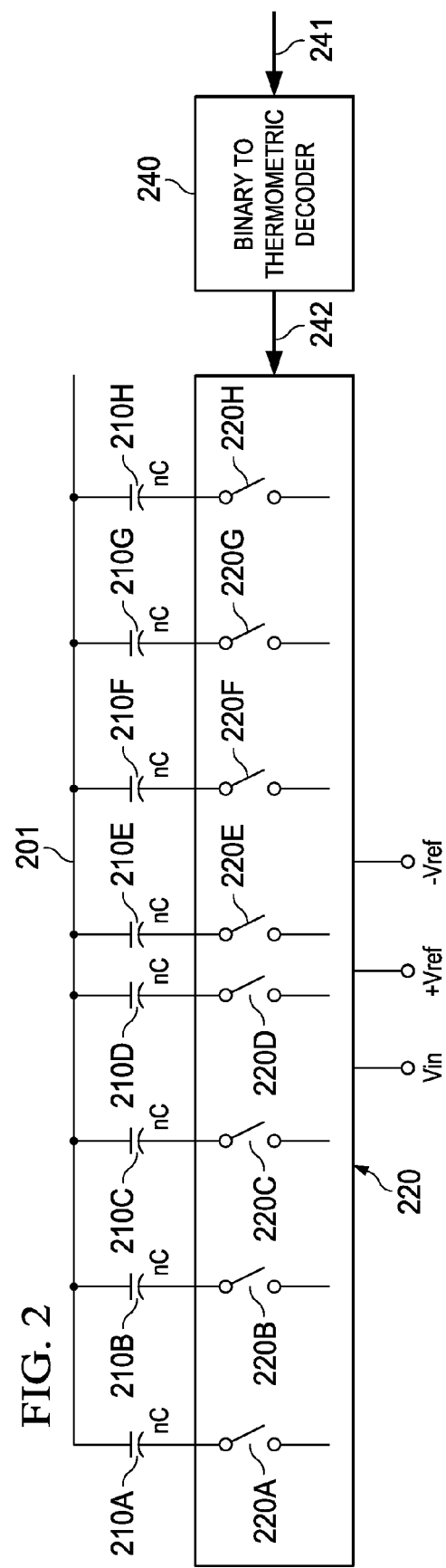

|  | COL 1 | COL 2 | COL 3 | COL 4 | COL 5 | COL 6 | COL 7 | COL 8 |
|---|---|---|---|---|---|---|---|---|
| ROW A | ⊥⊤ | ⊥⊤ | ⊥⊤ | ⊥⊤ | ⊥⊤ | ⊥⊤ | ⊥⊤ | ⊥⊤ |
| ROW B | ⊥⊤ | ⊥⊤ | ⊥⊤ | ⊥⊤ | ⊥⊤ | ⊥⊤ | ⊥⊤ | ⊥⊤ |
| ROW C | ⊥⊤ | ⊥⊤ | ⊥⊤ | ⊥⊤ | ⊥⊤ | ⊥⊤ | ⊥⊤ | ⊥⊤ |
| ROW D | ⊥⊤ | ⊥⊤ | ⊥⊤ | ⊥⊤ | ⊥⊤ | ⊥⊤ | ⊥⊤ | ⊥⊤ |
| ROW E | ⊥⊤ | ⊥⊤ | ⊥⊤ | ⊥⊤ | ⊥⊤ | ⊥⊤ | ⊥⊤ | ⊥⊤ |
| ROW F | ⊥⊤ | ⊥⊤ | ⊥⊤ | ⊥⊤ | ⊥⊤ | ⊥⊤ | ⊥⊤ | ⊥⊤ |
| ROW G | ⊥⊤ | ⊥⊤ | ⊥⊤ | ⊥⊤ | ⊥⊤ | ⊥⊤ | ⊥⊤ | ⊥⊤ |
| ROW H | ⊥⊤ | ⊥⊤ | ⊥⊤ | ⊥⊤ | ⊥⊤ | ⊥⊤ | ⊥⊤ | ⊥⊤ |

| | COL 1 | COL 2 | COL 3 | COL 4 | COL 5 | COL 6 | COL 7 | COL 8 |
|---|---|---|---|---|---|---|---|---|
| ROW A | 620-6 | 620-3 | 620-7 | 620-8 | 620-2 | 620-5 | 620-1 | 620-4 |
| ROW B | 620-1 | 620-4 | 620-2 | 620-5 | 620-7 | 620-8 | 620-6 | 620-3 |
| ROW C | 620-5 | 620-2 | 620-4 | 620-1 | 620-3 | 620-6 | 620-8 | 620-7 |
| ROW D | 620-8 | 620-7 | 620-3 | 620-6 | 620-4 | 620-1 | 620-5 | 620-2 |
| ROW E | 620-2 | 620-5 | 620-1 | 620-4 | 620-6 | 620-3 | 620-7 | 620-8 |
| ROW F | 620-7 | 620-8 | 620-6 | 620-3 | 620-1 | 620-4 | 620-2 | 620-5 |
| ROW G | 620-3 | 620-6 | 620-8 | 620-7 | 620-5 | 620-2 | 620-4 | 620-1 |
| ROW H | 620-4 | 620-1 | 620-5 | 620-2 | 620-8 | 620-7 | 620-3 | 620-6 |

| | MSB BITS 720 | | | MSB BANK BOTTOM PLATE VOLTAGES 730 | | | | | | | |
|---|---|---|---|---|---|---|---|---|---|---|---|
| 710 | BIT 1 | BIT 2 | BIT 3 | CAPACITOR BANK 620-1 | CAPACITOR BANK 620-2 | CAPACITOR BANK 620-3 | CAPACITOR BANK 620-4 | CAPACITOR BANK 620-5 | CAPACITOR BANK 620-6 | CAPACITOR BANK 620-7 | CAPACITOR BANK 620-8 |
| FIRST SAMPLE | 0 | 0 | 0 | REF- | REF- | REF- | REF- | REF- | REF- | REF- | NA |
| | 0 | 0 | 1 | REF+ | REF- | REF- | REF- | REF- | REF- | REF- | NA |
| | 0 | 1 | 0 | REF+ | REF+ | REF- | REF- | REF- | REF- | REF- | NA |
| | 0 | 1 | 1 | REF+ | REF+ | REF+ | REF- | REF- | REF- | REF- | NA |
| | 1 | 0 | 0 | REF+ | REF+ | REF+ | REF+ | REF- | REF- | REF- | NA |
| | 1 | 0 | 1 | REF+ | REF+ | REF+ | REF+ | REF+ | REF- | REF- | NA |
| | 1 | 1 | 0 | REF+ | REF+ | REF+ | REF+ | REF+ | REF+ | REF- | NA |
| | 1 | 1 | 1 | REF+ | REF+ | REF+ | REF+ | REF+ | REF+ | REF+ | NA |

FIG. 7B

| | MSB BITS | | | MSB BANK 1 BOTTOM PLATE VOLTAGES | | | | | | | |
|---|---|---|---|---|---|---|---|---|---|---|---|
| | BIT 1 | BIT 2 | BIT 3 | CAPACITOR BANK 620-1 | CAPACITOR BANK 620-2 | CAPACITOR BANK 620-3 | CAPACITOR BANK 620-4 | CAPACITOR BANK 620-5 | CAPACITOR BANK 620-6 | CAPACITOR BANK 620-7 | CAPACITOR BANK 620-8 |
| SECOND SAMPLE | 0 | 0 | 0 | REF- | NA | REF- | REF- | REF- | REF- | REF- | REF- |
| | 0 | 0 | 1 | REF- | NA | REF+ | REF- | REF- | REF- | REF- | REF- |
| | 0 | 1 | 0 | REF- | NA | REF+ | REF+ | REF- | REF- | REF- | REF- |
| | 0 | 1 | 1 | REF- | NA | REF+ | REF+ | REF+ | REF- | REF- | REF- |
| | 1 | 0 | 0 | REF- | NA | REF+ | REF+ | REF+ | REF+ | REF- | REF- |
| | 1 | 0 | 1 | REF- | NA | REF+ | REF+ | REF+ | REF+ | REF+ | REF- |
| | 1 | 1 | 0 | REF- | NA | REF+ | REF+ | REF+ | REF+ | REF+ | REF- |
| | 1 | 1 | 1 | REF+ | NA | REF+ | REF+ | REF+ | REF+ | REF+ | REF+ |

FIG. 7C

| | MSB BITS 720 | | | MSB BANK 1 BOTTOM PLATE VOLTAGES 730 | | | | | | | |
|---|---|---|---|---|---|---|---|---|---|---|---|
| | BIT 1 | BIT 2 | BIT 3 | CAPACITOR BANK 620-1 | CAPACITOR BANK 620-2 | CAPACITOR BANK 620-3 | CAPACITOR BANK 620-4 | CAPACITOR BANK 620-5 | CAPACITOR BANK 620-6 | CAPACITOR BANK 620-7 | CAPACITOR BANK 620-8 |
| THIRD SAMPLE | 0 | 0 | 0 | REF- | REF- | REF- | NA | REF- | REF- | REF- | REF- |
| | 0 | 0 | 1 | REF- | REF- | REF- | NA | REF+ | REF- | REF- | REF- |
| | 0 | 1 | 0 | REF- | REF- | REF- | NA | REF+ | REF+ | REF- | REF- |
| | 0 | 1 | 1 | REF- | REF- | REF- | NA | REF+ | REF+ | REF+ | REF- |
| | 1 | 0 | 0 | REF+ | REF+ | REF- | NA | REF+ | REF+ | REF+ | REF+ |
| | 1 | 0 | 1 | REF+ | REF+ | REF+ | NA | REF+ | REF+ | REF+ | REF+ |
| | 1 | 1 | 0 | REF+ | REF+ | REF+ | NA | REF+ | REF+ | REF+ | REF+ |
| | 1 | 1 | 1 | REF+ | REF+ | REF+ | NA | REF+ | REF+ | REF+ | REF+ |

| | MSB BITS 720 | | | MSB BANK 1 BOTTOM PLATE VOLTAGES 730 | | | | | | | |
|---|---|---|---|---|---|---|---|---|---|---|---|
| 710 | BIT 1 | BIT 2 | BIT 3 | CAPACITOR BANK 620-1 | CAPACITOR BANK 620-2 | CAPACITOR BANK 620-3 | CAPACITOR BANK 620-4 | CAPACITOR BANK 620-5 | CAPACITOR BANK 620-6 | CAPACITOR BANK 620-7 | CAPACITOR BANK 620-8 |
| FOURTH SAMPLE | 0 | 0 | 0 | REF- | REF- | REF- | REF- | REF- | NA | REF- | REF- |
| | 0 | 0 | 1 | REF- | REF- | REF- | REF- | REF- | NA | REF+ | REF- |
| | 0 | 1 | 0 | REF+ | REF- | REF- | REF- | REF- | NA | REF+ | REF+ |
| | 0 | 1 | 1 | REF+ | REF+ | REF+ | REF- | REF- | NA | REF+ | REF+ |
| | 1 | 0 | 0 | REF+ | REF+ | REF+ | REF+ | REF- | NA | REF+ | REF+ |
| | 1 | 0 | 1 | REF+ | REF+ | REF+ | REF+ | REF+ | NA | REF+ | REF+ |
| | 1 | 1 | 0 | REF+ | REF+ | REF+ | REF+ | REF+ | NA | REF+ | REF+ |
| | 1 | 1 | 1 | REF+ | REF+ | REF+ | REF+ | REF+ | NA | REF+ | REF+ |

FIG. 7E

| MSB BITS | | | MSB BANK 1 BOTTOM PLATE VOLTAGES | | | | | | | |
|---|---|---|---|---|---|---|---|---|---|---|
| BIT 4 | BIT 5 | BIT 6 | CAPACITOR BANK 620-8(1) | CAPACITOR BANK 620-8(2) | CAPACITOR BANK 620-8(3) | CAPACITOR BANK 620-8(4) | CAPACITOR BANK 620-8(5) | CAPACITOR BANK 620-8(6) | CAPACITOR BANK 620-8(7) | CAPACITOR BANK 620-8(8) |
| 0 | 0 | 0 | REF- | REF- | REF- | REF- | REF- | REF- | REF- | REF- |
| 0 | 0 | 1 | REF+ | REF- | REF- | REF- | REF- | REF- | REF- | REF- |
| 0 | 1 | 0 | REF+ | REF+ | REF- | REF- | REF- | REF- | REF- | REF- |
| 0 | 1 | 1 | REF+ | REF+ | REF+ | REF- | REF- | REF- | REF- | REF- |
| 1 | 0 | 0 | REF+ | REF+ | REF+ | REF+ | REF- | REF- | REF- | REF- |
| 1 | 0 | 1 | REF+ | REF+ | REF+ | REF+ | REF+ | REF- | REF- | REF- |
| 1 | 1 | 0 | REF+ | REF+ | REF+ | REF+ | REF+ | REF+ | REF- | REF- |
| 1 | 1 | 1 | REF+ | REF+ | REF+ | REF+ | REF+ | REF+ | REF+ | REF+ |

FIRST SAMPLE 720  730

FIG. 7F

| | MSB BITS | | | MSB BANK 1 BOTTOM PLATE VOLTAGES | | | | | | | |
|---|---|---|---|---|---|---|---|---|---|---|---|
| | BIT 4 | BIT 5 | BIT 6 | CAPACITOR BANK 620-2(1) | CAPACITOR BANK 620-2(2) | CAPACITOR BANK 620-2(3) | CAPACITOR BANK 620-2(4) | CAPACITOR BANK 620-2(5) | CAPACITOR BANK 620-2(6) | CAPACITOR BANK 620-2(7) | CAPACITOR BANK 620-2(8) |
| SECOND SAMPLE | 0 | 0 | 0 | REF- | REF- | REF- | REF- | REF- | REF- | REF- | REF- |
| | 0 | 0 | 1 | REF+ | REF- | REF- | REF- | REF- | REF- | REF- | REF- |
| | 0 | 1 | 0 | REF+ | REF+ | REF- | REF- | REF- | REF- | REF- | REF- |
| | 0 | 1 | 1 | REF+ | REF+ | REF+ | REF- | REF- | REF- | REF- | REF- |
| | 1 | 0 | 0 | REF+ | REF+ | REF+ | REF+ | REF- | REF- | REF- | REF- |
| | 1 | 0 | 1 | REF+ | REF+ | REF+ | REF+ | REF+ | REF- | REF- | REF- |
| | 1 | 1 | 0 | REF+ | REF+ | REF+ | REF+ | REF+ | REF+ | REF- | REF- |
| | 1 | 1 | 1 | REF+ | REF+ | REF+ | REF+ | REF+ | REF+ | REF+ | REF- |

720 — MSB BITS
730 — MSB BANK 1 BOTTOM PLATE VOLTAGES

FIG. 7G

| | MSB BITS | | | MSB BANK 1 BOTTOM PLATE VOLTAGES | | | | | | | |
|---|---|---|---|---|---|---|---|---|---|---|---|
| | BIT 4 | BIT 5 | BIT 6 | CAPACITOR BANK 620-4(1) | CAPACITOR BANK 620-4(2) | CAPACITOR BANK 620-4(3) | CAPACITOR BANK 620-4(4) | CAPACITOR BANK 620-4(5) | CAPACITOR BANK 620-4(6) | CAPACITOR BANK 620-4(7) | CAPACITOR BANK 620-4(8) |
| THIRD SAMPLE | 0 | 0 | 0 | REF- | REF- | REF- | REF- | REF- | REF- | REF- | REF- |
| | 0 | 0 | 1 | REF+ | REF- | REF- | REF- | REF- | REF- | REF- | REF- |
| | 0 | 1 | 0 | REF+ | REF+ | REF- | REF- | REF- | REF- | REF- | REF- |
| | 0 | 1 | 1 | REF+ | REF+ | REF+ | REF- | REF- | REF- | REF- | REF- |
| | 1 | 0 | 0 | REF+ | REF+ | REF+ | REF+ | REF- | REF- | REF- | REF- |
| | 1 | 0 | 1 | REF+ | REF+ | REF+ | REF+ | REF+ | REF- | REF- | REF- |
| | 1 | 1 | 0 | REF+ | REF+ | REF+ | REF+ | REF+ | REF+ | REF- | REF- |
| | 1 | 1 | 1 | REF+ | REF+ | REF+ | REF+ | REF+ | REF+ | REF+ | REF- |

FIG. 7H

| MSB BITS | | | MSB BANK 1 BOTTOM PLATE VOLTAGES 730 | | | | | | | |
|---|---|---|---|---|---|---|---|---|---|---|
| BIT 4 | BIT 5 | BIT 6 | CAPACITOR BANK 620-6(1) | CAPACITOR BANK 620-6(2) | CAPACITOR BANK 620-6(3) | CAPACITOR BANK 620-6(4) | CAPACITOR BANK 620-6(5) | CAPACITOR BANK 620-6(6) | CAPACITOR BANK 620-6(7) | CAPACITOR BANK 620-6(8) |
| 0 | 0 | 0 | REF- | REF- | REF- | REF- | REF- | REF- | REF- | REF- |
| 0 | 0 | 1 | REF+ | REF- | REF- | REF- | REF- | REF- | REF- | REF- |
| 0 | 1 | 0 | REF+ | REF+ | REF- | REF- | REF- | REF- | REF- | REF- |
| 0 | 1 | 1 | REF+ | REF+ | REF+ | REF- | REF- | REF- | REF- | REF- |
| 1 | 0 | 0 | REF+ | REF+ | REF+ | REF+ | REF- | REF- | REF- | REF- |
| 1 | 0 | 1 | REF+ | REF+ | REF+ | REF+ | REF+ | REF- | REF- | REF- |
| 1 | 1 | 0 | REF+ | REF+ | REF+ | REF+ | REF+ | REF+ | REF- | REF- |
| 1 | 1 | 1 | REF+ | REF+ | REF+ | REF+ | REF+ | REF+ | REF+ | REF- |

720 ⎿ FOURTH SAMPLE

|  | COL 1 | COL 2 | COL 3 | COL 4 | COL 5 | COL 6 | COL 7 | COL 8 |
|---|---|---|---|---|---|---|---|---|
| ROW A | 620-6(4) | 620-3 | 620-7 | 620-8 | 620-2 | 620-5 | 620-1 | 620-4 |
| ROW B | 620-1 | 620-4 | 620-2 | 620-5 | 620-7 | 620-8 | 620-6(6) | 620-3 |
| ROW C | 620-5 | 620-2 | 620-4 | 620-1 | 620-3 | 620-6(8) | 620-8 | 620-7 |
| ROW D | 620-8 | 620-7 | 620-3 | 620-6(2) | 620-4 | 620-1 | 620-5 | 620-2 |
| ROW E | 620-2 | 620-5 | 620-1 | 620-4 | 620-6(1) | 620-3 | 620-7 | 620-8 |
| ROW F | 620-7 | 620-8 | 620-6(5) | 620-3 | 620-1 | 620-4 | 620-2 | 620-5 |
| ROW G | 620-3 | 620-6(7) | 620-8 | 620-7 | 620-5 | 620-2 | 620-4 | 620-1 |
| ROW H | 620-4 | 620-1 | 620-5 | 620-2 | 620-8 | 620-7 | 620-3 | 620-6(3) |

REDUCING THE EFFECT OF ELEMENTS MISMATCH IN A SAR ADC

TECHNICAL FIELD

The present disclosure relates generally to analog-to-digital converter (ADCs), and more specifically, to reducing effect of elements mismatch in a Successive Approximation Register (SAR) based ADC.

RELATED ART

An ADC converts sampled value of an analog signal into digital code comprising a finite number of bits (e.g., N bits) as well known in the relevant art. In general, a SAR ADC generates a digital code bit-by-bit by successively comparing the input analog signal sample with the analog value of an intermediate digital code. The intermediate digital code is often generated sequentially by testing each bit from most significant bit (MSB) to least significant bit (LSB). SAR ADCs generally employ digital-to-analog converter (DAC) to generate intermediate analog value corresponding to the intermediate digital code. Operation of a conventional SAR ADC can be seen in U.S. Pat. No. 6,894,627 which is incorporated herein by reference.

DAC in the SAR ADC is often implemented using different techniques (such as binary weighted decoding and Thermometric Decoding) as well known in the field of art. In a thermometric decoder type DAC, each element is constructed with a same value. A thermometric decoder is used to connect desired number of elements to form a ratio corresponding to the intermediate digital code as is well known in the art. Every element value is desired to be matched with each other for accurate representation of intermediate digital code.

Often there exists a mismatch between the elements. One source of mismatch may be the difference in physical parameter across the integrated circuit caused in the fabrication process. Such mismatch may affect accuracy of the digital code generated.

SUMMARY

According to one aspect of present disclosure an intermediate set of bits in a SAR ADC is converted to two or more intermediate analog values respectively from two or more different set of representative capacitor banks. The intermediate analog values are compared with input analog sample to generate a accurate digital code bits. According to another aspect, the different set of capacitors is selected from different location to reduce the effect of capacitor mismatch due to variations in the fabrication process. According to another aspect, the different set of capacitors is selected from the thermometric code corresponding to intermediate set of bits.

According to yet another aspect, the conversion process is repeated for only LSB part of the intermediate digital bit keeping MSB bits same. The representative capacitors representing the MSB bit are changed in each conversion process.

According to another aspect, each capacitor bank contains at least one unit capacitor in each row and/or column of two dimensional capacitor arty formed on a semiconductor die within the integrated circuit.

According to another aspect, resolution of a N bit SAR ADC is enhanced by generating more than one N bits digital codes correspondingly operating the N Bit SARADC with more than on transfer functions. Each transfer function is selected such that they are offset by a fraction of LSB value. The more than one N bits digital codes are then added to form P bits digital code such that P is greater than N due to addition.

BRIEF DESCRIPTION OF DRAWINGS

FIG. 1 is a block diagram of an example SAR ADC in accordance with the present disclosure.

FIG. 2 is a circuit diagram depicting an example capacitor array employed in DAC of FIG. 1.

FIG. 6 capacitor grids in an example integrated circuit incorporating the SAR ADC.

FIGS. 7A through 7D illustrates capacitor banks connection for first three MSB bits (bit 1, bit 2, and bit 3).

FIGS. 7E through 7H illustrates capacitor banks connection for remaining three MSB bits (bit 4, bit 5, and bit 6).

FIG. 8A through 8D respectively represents capacitor bank configuration within the grid while generating first, second, third, and fourth SAR ADC outputs.

DETAILED DESCRIPTION OF THE PREFERRED EXAMPLES

Figures 3, 4:
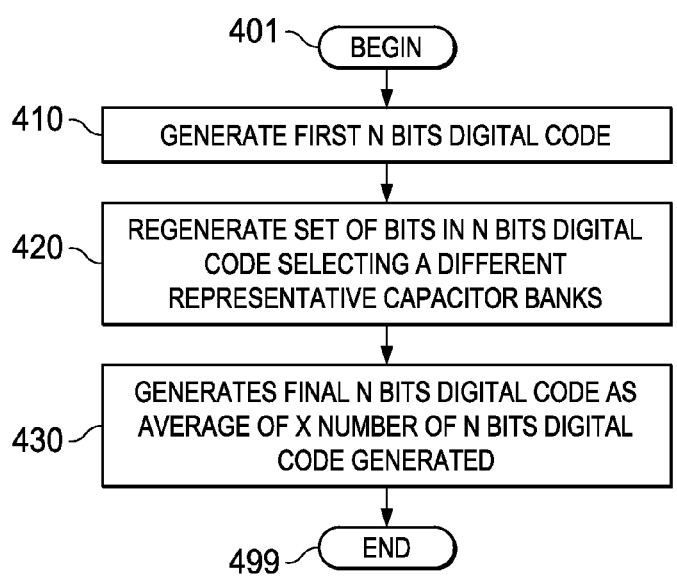
FIG. 3 depicts the manner in which unit capacitors are implemented on semiconductor die for the example array of FIG. 2.
FIG. 4 is a flowchart illustrating manner in which an N bits digital code may be generated in the SAR ADC of FIG. 1.

In FIG. 1, a block diagram of an example SAR ADC 100 can be seen. The SAR ADC 100 is shown containing sample-and-hold (S/H) circuit 110, a DAC 150, a comparator 170, and SAR logic 190. Each block is described in further detail below.

Sample and Hold (S/H) circuit 110 samples input analog signal received on path 101 at a time instant and holds the analog sample (sampled value) on path 117 for a desired length of time for further processing. The S/H circuit 110 may be operated by a clock signal to control sampling rate and also to hold the sample for a desired length of time. The S/H circuit 110 may also be implemented using known techniques.

Comparator 170 compares analog signals on its input paths 157 and 117 and generates a logical value "1" as output on path 179 if the value of the analog signal on path 117 (non-inverting input terminal) is higher than that of analog signal on path 157 (inverting terminal). Comparator 170 generates logical value "0" otherwise. Comparator 170 may be implemented using any of the known techniques in the relevant art.

SAR logic 190 generates an intermediate digital code at every clock cycle and sends the intermediate digital code to DAC 150 on path 195. Each intermediate digital code is generated at every clock cycle to sequentially test (determine) bit value from MSB to LSB in N bit digital code as well known in the field of art. In each clock cycle SAR 190, determine value tested bit based on result of comparison from comparator 170. At the end of the N clock cycle SAR logic 190 sends N determined bits as SAR ADC output 199.

DAC 150 converts intermediate digital code received on path 195 to an intermediate analog value. The intermediate analog value is provided on path 157 for comparison. DAC 150 employs array of elements such as capacitor and/or resistors to generate an intermediate analog signal. Often capacitors are used as elements of the array due to several advantages such as implementation complexity, power efficiency etc.

FIG. 2 is a circuit diagram depicting part of DAC 150. Shown there, an array of capacitors 210A through 210H, switches 220A through 220H (together referred to as switch arrangement 220) and binary to thermometric decoder 240. Each component is further described below.

Binary to thermometric decoder 240 converts an intermediate digital code received on path 241 to a thermometric code. For example, an N bit binary intermediate digital code is converted to $2^N-1$ bits thermometric code. The thermometric code is provided to switch arrangement on path 242.

Each switch 220A through 220H is respectively operated by K bits of intermediate digital code (by corresponding $2^k-1$ thermometric code) where K is less than equal to N. As an example, switches 220A through 220H connect bottom plate of the capacitors 210A through 210H to reference voltage +Vref if the bit operating the respective switch is at logic 1 and connects to reference voltage −Vref otherwise. The capacitors coupled to reference voltage +Vref are referred to as representative capacitor since total capacitance of representative capacitor corresponds to binary weighted sum of digital code operating the switches.

As an example, FIG. 2 may represent a partial implementation of K bits of N bits DAC 150 while other part of the DAC 150 may be implemented using any other known way. Thus, desired K bits among N bits are sent on path 241. Remaining N-K bits (MSB or LSB side) may be generated in a similar way or by using any other techniques such as binary weighted array. In case N-K bits represents MSB side bits, circuit in FIG. 2 effectively samples the difference between input analog sample and analog value formed by N-K bits of intermediate digital code as well known in the art.

Each capacitor 210A through 210H represents a unit capacitor or group of unit capacitors (hereinafter "capacitor bank") forming a desired capacitance value. The manner in which unit capacitors are implemented on semiconductor die in an example depicted in FIG. 3. As shown there, desired number of unit capacitors are spread (implemented) on a two dimensional array (grid) across the semiconductor die 310. Capacitor banks 210A through 210H are formed by combining/coupling unit capacitors at different location. For example a capacitor bank of 4C capacitors (C representing a unit of capacitance) may be formed by coupling capacitor on row A and col3, row C and col 4, row E and col 6, and row H and col7 (together called capacitor bank). Similarly another capacitor bank of same value may be implemented by selecting set of other 4 capacitors in the grid.

Continuing reference to FIG. 2, each capacitor bank is shown with capacitance value of nC. Alternatively, capacitor bank 210A-210D may be implemented with one value of capacitance (for example C) and capacitor 210E-210H may be implemented with other capacitance value (for example nC). In FIG. 2, one end of the capacitor bank is shown coupled to a common terminal 201 and other end of each capacitor is selectively coupled to one of reference voltages +Vref and −Vref (by switch arrangement 220) depending on the thermometric code received on path 242.

Thus, a thermometric code 1110000 (corresponding to a 3 bits of intermediate digital code 011) connects three capacitor banks 210F through 210H (representative capacitor corresponding to code 011) to reference voltage +Vref and other five capacitor banks 210A through 210E to −Vref thereby forming a voltage on the terminal 201 proportional to capacitance ratio 3(nC)/8(nC). Similarly, different thermometric code forms different ratio on terminal 201 thereby generating an analog voltage proportional to the intermediate digital code. Connections to form the voltage on terminal 201 proportional to the ratio of capacitance may be implemented in different ways depending on the reference voltages used for generating the ratios.

However, it may be appreciated that mismatch in the unit capacitor may cause error in the desired ratio formed at the terminal 201, thereby causing an error in the voltage representing intermediate digital code. Manner in which effect of such mismatch may be reduced in an example is described below referring to FIG. 4

FIG. 4 is a flowchart illustrating manner in which an N bits digital code may be generated in an example of SAR ADC. Flowchart begins in step 401 and control passes to step 410.

In step 410, SAR ADC 150 generates a first N bit digital code in N clock cycle by successively testing each bit in one clock cycle. SAR ADC may use thermometric decoding DAC for desired number of MSB bits and any other techniques such as binary weighted capacitor array DAC for remaining lower order bits. In one example, thermometric decoding is used for N-K MSB bits while K lower order bits of N bits are implemented with other techniques.

In step 420, SAR ADC 150 regenerates set of bits in N bits digital code selecting a different capacitor banks to represent the intermediate digital code. As an example, regenerated set of bits may correspond to K LSB bits while selecting a different capacitor banks to represent N-K MSB bits. The K bits are generated by repeating conversion process by keeping N-K bits value same. Thus, K clock cycles are used for generating N bits digital code word.

Step 420 may be repeated desired number of time to generate desired number of N bits digital code. For example, if step 420 is repeated Y number of times, then Y number of N bits digital codes are generated in Y*K clock cycles wherein symbol * representation multiplication operation.

In step 430, SAR ADC 150 generates final N bits digital code as average of the number of N bits digital codes generated. Any of the known averaging techniques may be used for generating the average of Y numbers of N bits digital code. In an alternative example, Y numbers of N bits digital code may be added to generate a P bits final digital code where P is greater than N due to addition. Flow chart ends in step 499.

Due to above approach the error caused by the capacitor mismatch is reduced. Operation of SAR ADC 100 as described with reference to FIG. 4 is further illustrated below.

Figure 5:
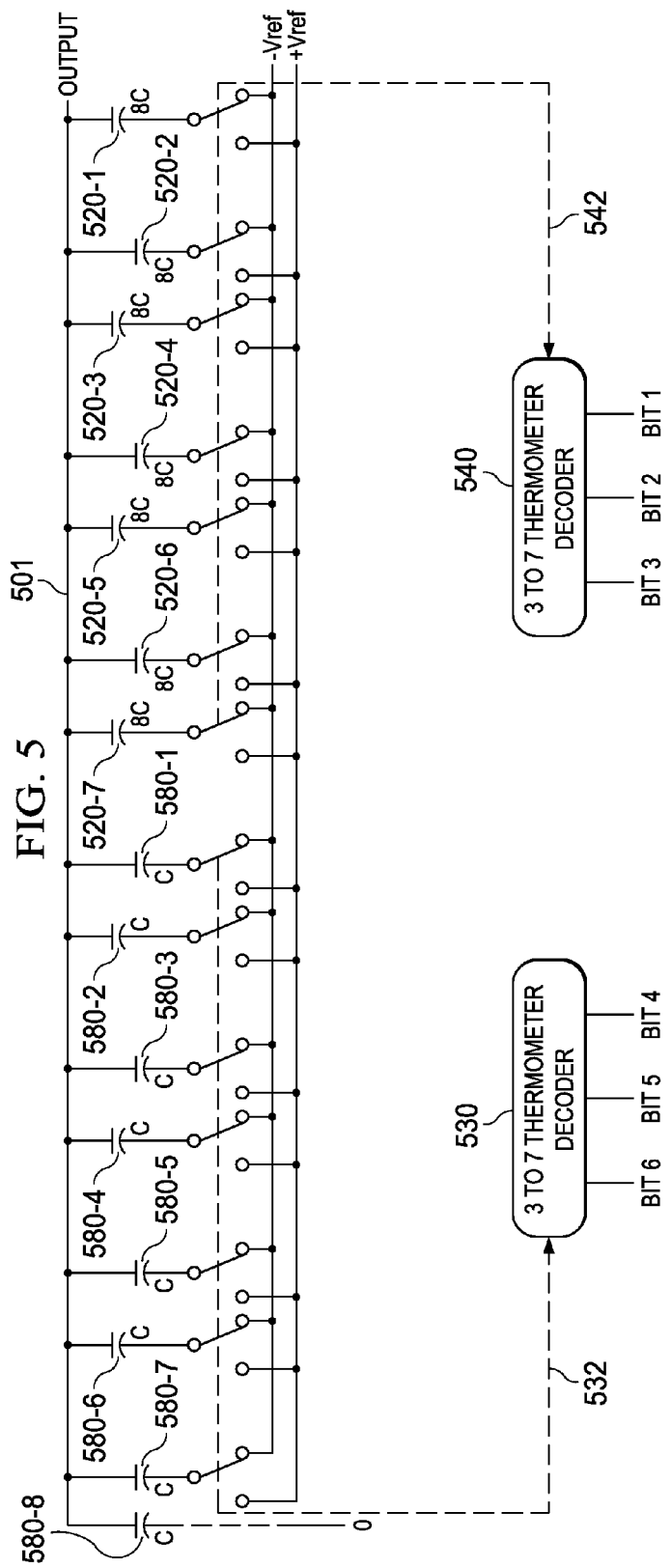
FIG. 5 is a circuit diagram of an example 6 bit thermometric decoder DAC.

FIG. 5 is a circuit diagram of 6 bit thermometric decoder DAC as an example. The FIG. is shown containing 8C capacitor banks 520-1 through 520-7, 1C capacitor banks 580-1 through 580-8, Thermometric/thermometer decoders 530 and 540. Each component is described below in further detail.

Each 8C capacitor banks 520-1 through 520-7 are formed by coupling eight 1C (unit capacitor) capacitors in an 8×8 unit capacitors grid. Manner in which unit capacitors in the grid are selectively coupled to form capacitor banks 520-1 through 520-7 and 580-1 through 580-8 in order to reduce integral nonlinearity is described with reference to FIG. 6.

FIG. 6 is a capacitor grid in an integrated circuit incorporating SAR ADC 100. In grid 600 each square (block) represents physical location of unit capacitor on a semiconductor die. Each physical location in the grid is identified by (row, col) with rows A-H and columns 1-8. As is well known in the art, process variation may cause variation/gradient in the capacitance value across semiconductor die or grid 600. Effect of such variation/gradient may result in integral non linearity (INL) error in the digital code generated by SAR ADC. Such variation may be countered by forming capacitor banks as described below.

In FIG. 6, each square is shown marked with bank numbers 620-1 through 620-8 representing the capacitors selected to form respective banks. For example, capacitor bank 620-1 is shown containing (formed by) group of eight unit capacitor at locations (A,7), (B,1), (C,4), (D,6), (E,3), (F,5), (G,8), and (H,2). Similarly capacitor bank 620-2 is formed by group of eight unit capacitor at location (A,5), (B,3), (C,2), (D,8), (E,1), (F,7), (G,6), and (H,4). It may be observed that, each capacitor bank 620-1 through 620-8 is formed by selecting at least one unit capacitor in every row A-H. Alternatively, each capacitor bank may also be formed by selecting at least one unit capacitor in every column or by meeting both row and column conditions. As a further alternative, capacitors may be selected based on a distribution function representing the process variation either in x (column wise) or y (row wise) direction.

Referring to FIG. 5, capacitor banks 520-1 through 520-7 are dynamically selected from eight capacitor banks 620-1 through 620-8.

Unit capacitor banks 580-1 to 580-8 may be formed by splitting any one (unused) of the capacitor banks 620-1 through 620-8. For example, capacitor bank 620-8 may be split in to 8 unit capacitors and banks 580-1 to 580-8 may be formed respectively by unit capacitors at locations (A,4), (B,6), (C,7), (D,1), (E,8), (F,2), (G,3), and (H,5).

Continuing with reference to FIG. 5, thermometric decoder 540 receives MSB bits 1, 2 and 3 and converts 3 MSB bits (bit 1, bit 2 and bit 3) of an intermediate digital code to 7 bit thermometric code on path 542. Similarly, thermometric decoder 530 converts remaining 3 bits (bit 4, bit 5 and bit 6) of the intermediate digital code to 7 bit thermometric code on path 532. Accordingly, 7 bits thermometric code on path 542 operates/controls 7 switches to connect 7 capacitor banks 520-1 through 520-7 to one of reference voltages +Vref and −Vref. Similarly, 7 bits thermometric code on path 532 operates/controls 7 switches to connect 7 capacitor banks 580-1 through 580-7 to one of reference voltages +Vref and −Vref. Capacitor bank 580-8 is showed coupled to reference voltage −Vref.

Manner in which N bits digital code may be generated multiple times in accordance with FIG. 4 is further illustrated below with reference to FIG. 7A through 7H. FIGS. 7A through 7D illustrates capacitor banks connection for first three MSB bits (bit 1, bit 2 and bit 3). FIGS. 7E through 7H illustrates capacitor banks connection for remaining three MSB bits (bit 4, bit 5, and bit 6).

FIG. 7A is a table depicting selection of capacitor banks for 3 MSB bits (bit1, bit2, bit3) of the intermediate digital code while generating first SAR ADC output. Eight rows in the table correspond to eight possible combinations of MSB bits (bit 1, bit 2 and bit 3) and eight columns (in part 730 of the table) correspond to eight capacitor banks. Column 1-8 represents capacitors banks 620-1 through 620-8 in grid 600. As shown there, 7 capacitor banks 620-1 through 620-7 are operated by 3 MSB bits (bit1, bit2, bit3) and there by represents capacitor banks 580-1 through 580-7 in FIG. 5. Each entry in section 730 indicates connection of bottom plates of capacitor banks for a particular combination of 3 MSB bits. Capacitor bank 620-8 is not operated by 3 MSB bits in generating first SAR ADC output and hence marked "NA" (Not Accounted).

As shown in FIG. 7A, entries on row 1, corresponding to condition when 3 MSB bits are 000 (bit1, bit2, bit3), all the capacitor banks (column 1-7) are shown coupled to reference voltage −Vref. Row 2 entries correspond to condition when 3 MSB bits are at 001 (corresponds to 7 bit thermometric code of 1000000). Accordingly capacitor bank 1 is shown coupled to reference voltage +Vref and other banks coupled to reference voltage −Vref. Describing entries for row 5 corresponding to condition when MSB bits are 100 (corresponds to 7 bits thermometric code of 1111000), capacitor bank 1, bank 2, bank 3 and bank 4 are shown coupled to reference voltage +Vref. Other capacitor banks are shown coupled to reference voltage −Vref. Similarly for other values of 3 MSB bits, the entries depict connection of capacitor banks.

Continuing further, in FIGS. 7B through 7D, columns 2, 4 and 6 are respectively shown as unit capacitor banks as against column 8 in FIG. 7A. Thus, remaining seven columns represents capacitor banks 520-1 through 520-7. Such shuffling of unit capacitor bank may further enhance the performance/accuracy of SAR ADC 100. However, FIG. 7B through 7D may also be implemented by keeping column 8 unit capacitor banks as is apparent to one skilled in the art.

FIGS. 7B through 7D are described with reference to example MSB bit combination 100 for conciseness. All other entries in the tables are apparent to one skilled in the relevant art by reading the description provided herein.

FIG. 7B is a table depicting selection of capacitor banks for 3 MSB bits (bit1, bit2, bit3) while generating second SAR ADC output. As shown there, 7 capacitor banks 620-1, and 620-3 through 620-8 are operated by 3 MSB bits (bit1, bit2, bit3) and there by represents capacitor banks 580-1 through 580-7 in FIG. 5. Capacitor bank 620-2 is not operated by 3 MSB bits in generating second ADC output and hence marked "NA".

Continuing with example entry for MSB bits 100, capacitor bank3, bank 4, bank 5 and bank 6 are shown coupled to reference voltage +Vref and other banks are shown coupled to reference voltage −Vref. Such connection may be made by cyclically right shifting thermometric code 1111000 by two positions and shifted thermometric code may be used for operating the switches coupling the capacitor banks.

FIG. 7C is a table depicting selection of capacitor banks for 3 MSB bits (bit1, bit2, bit3) while generating third SAR ADC output. As shown there, 7 capacitor banks 620-1, 620-2, 620-3 and 620-5 through 620-8 are operated by 3 MSB bits (bit1, bit2, bit3) and there by represents capacitor banks 580-1 through 580-7 in FIG. 5. Capacitor bank 620-4 is not operated by 3 MSB bits in generating third ADC output and hence marked "NA".

Continuing with example entry for MSB bits 100, capacitor bank5, bank 6, bank 7 and bank 8 are shown coupled to reference voltage +Vref and other banks are shown coupled to −Vref. Such connection may be made by cyclically right shifting thermometric code 1111000 by 4 positions and shifted thermometric code may be used for operating the switches coupling the capacitor banks.

FIG. 7D is a table depicting selection of capacitor banks for 3 MSB bits (bit1, bit2, bit3) while generating fourth SAR ADC output. As shown there, 7 capacitor banks 620-1 through 620-5, 620-7 and 620-8 are operated by 3 MSB bits (bit1, bit2, bit3) and there by represents capacitor banks 580-1 through 580-7 in FIG. 5. Capacitor bank 620-4 is not used as part of 3 MSB bits in generating fourth ADC output and hence marked "NA".

Continuing with example entry for MSB bits 100, capacitor bank7, bank 8, bank 1 and bank 2 are shown coupled to reference voltage +Vref and other banks are shown coupled to reference voltage −Vref. Such connection may be made by cyclically right shifting thermometric code 1111000 by 6 positions and shifted thermometric code may be used for operating the switches coupling the capacitor banks.

FIG. 7E represents the capacitor bank selection for remaining three MSB bits (bit 4, bit5, bit6) while generating first SAR ADC output. The unused capacitor bank 620-8 from FIG. 7A is split into 8 unit capacitor banks 620-8(1) through 620-8(8) and used as capacitor banks 580-1 through 580-8 in FIG. 5. Thus, reaming 3 MSB bits (bit4, bit5, bit6) connects unit capacitor banks 620-8(1) through 620-8(8) as per the entries in region 730.

Similarly, FIGS. 7F through 7D represents capacitor selection for generating second, third and fourth SAR ADC outputs respectively for remaining three MSB bits. These figures are not further described here for conciseness however, the operation is apparent one ordinarily skilled in the art by reading the disclosure herein.

FIGS. 8A through 8D respectively represents example capacitor bank configuration within the grid for generating first, second, third, and fourth SAR ADC output.

The Four 6 bit outputs (first, second, third, and fourth SAR ADC outputs) generated according FIGS. 7A through 7H are averaged. Averaging of four 6 bit digital codes may be performed by known way.

Due to shuffling of capacitor bank each time (iteration) while generating output digital codes multiple times, the error due to mismatch of the capacitor is eliminated or at least reduced in some cases. Manner in which capacitor mismatch is eliminated when 6 MSB bits value is 100000 (bit1 through bit6) is further illustrated below.

As described above, FIGS. 7A and 7E generates an analog voltage on path 501 proportional to capacitance ratio1 given by:

$$\text{Ratio 1} = \frac{C1 + C2 + C3 + C4}{C1 + C2 + C3 + C4 + C5 + C6 + C7 + C8}, \quad (1)$$

where C1 through C8 respectively represent the capacitance value of capacitor banks 620-1 through 620-8.

FIGS. 7B and 7F generate an analog voltage on path 501 proportional to capacitance Ratio 2 given by:

(2)

$$\text{Ratio 2} = \frac{C3 + C4 + C5 + C6}{C1 + C2 + C3 + C4 + C5 + C6 + C7 + C8} \quad \text{Equation 2}$$

FIGS. 7C and 7G generate an analog voltage on path 501 proportional to capacitance ratio 3 given by:

$$\text{Ratio 3} = \frac{C5 + C6 + C7 + C8}{C1 + C2 + C3 + C4 + C5 + C6 + C7 + C8} \quad (3)$$

FIGS. 7D and 7H generate an analog voltage on path 501 proportional to capacitance ratio 4 given by:

$$\text{Ratio 4} = \frac{C7 + C8 + C1 + C2}{C1 + C2 + C3 + C4 + C5 + C6 + C7 + C8}, \quad (4)$$

where the Effect of averaging may be represented as:

$$= \frac{1}{4} \left( \frac{C1 + C2 + C3 + C4}{C1 + C2 + C3 + C4 + C5 + C6 + C7 + C8} + \frac{C3 + C4 + C5 + C6}{C1 + C2 + C3 + C4 + C5 + C6 + C7 + C8} + \right. \quad (5)$$

-continued
$$\left. \frac{C5 + C6 + C7 + C8}{C1 + C2 + C3 + C4 + C5 + C6 + C7 + C8} + \frac{C7 + C8 + C1 + C2}{C1 + C2 + C3 + C4 + C5 + C6 + C7 + C8} \right) =$$

$$\frac{1}{4} \left( \frac{2(C1 + C2 + C3 + C4 + C5 + C6 + C7 + C8)}{C1 + C2 + C3 + C4 + C5 + C6 + C7 + C8} \right) = \frac{1}{2}$$

Thus, from equation 5 it may be seen that the ratio is equal to ½ as desired for the intermediate digital code 100000. Further, equation 5 implies the ratio generated is independent of capacitor mismatch.

Further, using similar mathematical steps, it can be shown that effect of capacitor mismatch is cancelled when intermediate digital code is 010000 and effect of capacitor mismatch is at least reduced in other cases. Such mathematical steps are not including here for brevity and conciseness.

Though above description is made with reference to 6 MSB bits, the concept may be extended to any number of code lengths. Further, a part of N bits DAC may be operated according to aspects of the present disclosure while remaining part may be operated in any other known way. For example, in an N bit DAC, 3 or 6 MSB bits may be implemented according to the present disclosure described with reference FIGS. 4 through 8 while remaining bits may be implemented in any other known way.

In one example, a few LSB may be regenerated or tested multiple times in order to generate multiple N bits outputs by keeping the MSB bits value constant but with different capacitor bank configuration as described above. Number of LSB bits for regeneration may be determined based on the expected accuracy of the ADC.

Manner in which 3 bits are tested and regenerated multiple times by keeping MSB bits constant in 14 bit SAR ADC to enhance the accuracy is illustrated below with reference to FIG. 9.

Figure 9:
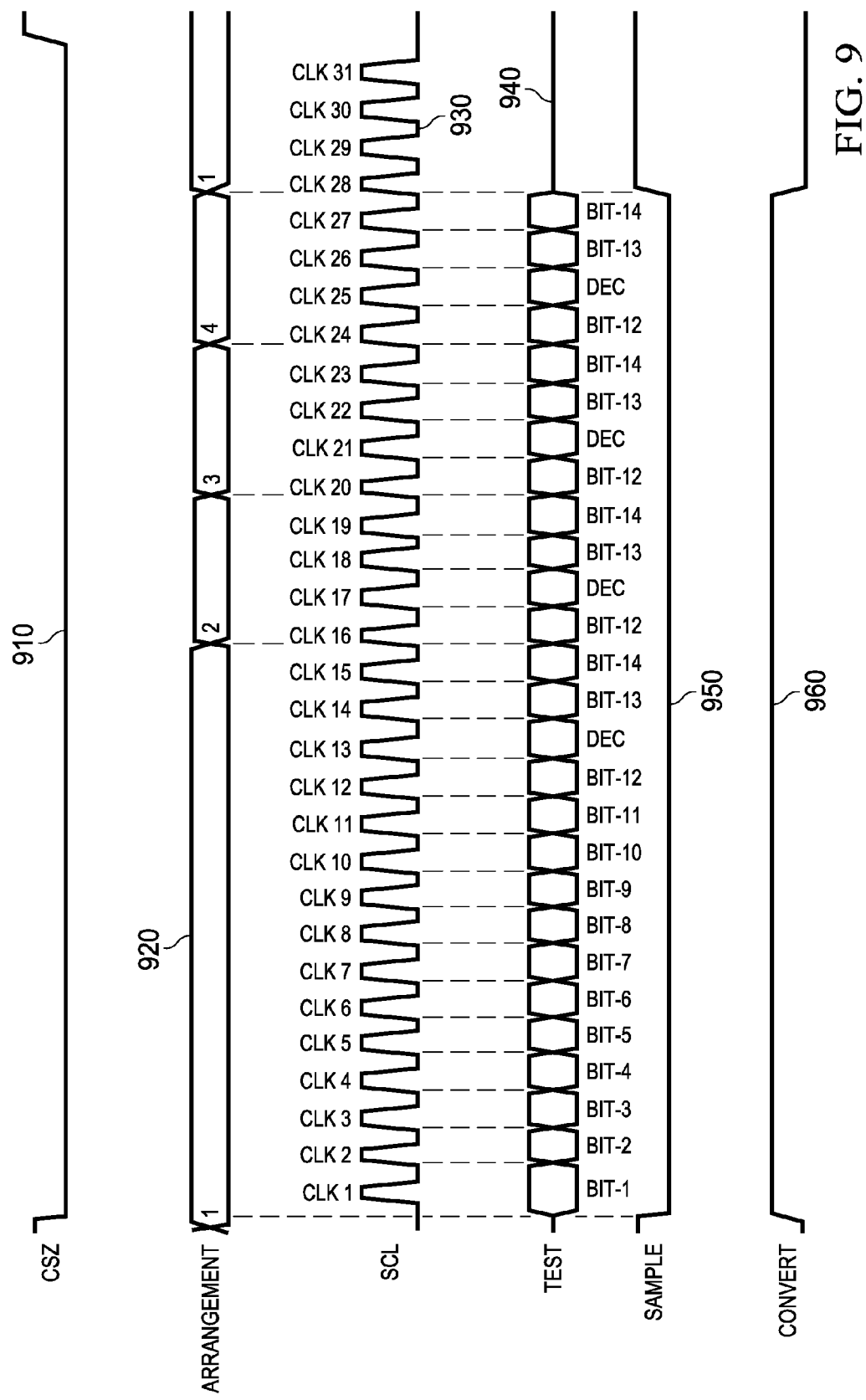
FIG. 9 is a timing diagram illustrating generation of 4 different 14 bit SAR ADC outputs by repeating conversion process for part of the 14 bits.

FIG. 9 is a timing diagram illustrating generation of 4 different 14 bit SAR ADC outputs by repeating conversion process for part of the 14 bits. Timing diagram is shown containing signals Chip Select CSZ 910, Arrangement 920, SCLK 930, Test bits 940, Sample 950, and Convert 960.

Chip select CSZ 910 selects the ADC chip (integrated circuit) and activates (an active low) the chip for operation. Chip select is maintained active low as long the chip (integrated circuit incorporating the SAR ADC 150) is required to be in operation. Convert 960 indicates start of conversion and end of conversion of analog input sample to corresponding digital code. It remains active low during conversion. Sample 950 samples analog input and hold the sampled analog signal for processing until the conversion process is complete. Test bit 940 represents bits tested at every clock cycle of the clock signal SCLK 930. Thus each bit is tested once every clock cycle of clock signals SCLK 930.

Arrangement 920 is shown containing arrangements 1, 2, 3 and 4 at different time duration within one conversion cycle 960. Each arrangement 1, 2, 3 and 4 generates 14 bit digital code output. Thus, four arrangements generate four outputs.

In arrangement 1, all 14 bits and a redundant bit (redundant 12$^{th}$ bit) are generated in 15 clock cycles (clock cycles 1-15). The redundant 12$^{th}$ bit is inserted in a 14 bit SAR ADC for error correction as well known in the art. Bits 1-6 of 14 bit SAR ADC is implemented according to description provided with reference FIG. 5 and bits 7 through 14 may be implemented using any known techniques such as binary weighted capacitor array or thermometric capacitor array or hybrid arrangements. Thus MSB bits 1-6 of an intermediate digital code are fed to thermometer decoder 540 and 530. As result MSB bits 1-3 operates the capacitor banks 520-1-520-7 and MSB bits 4-6 operates capacitor banks 580-1 through 580-8. Thus, in arrangement 1, first 14 bit output is generated using configuration described with reference to FIGS. 7A, 7E and 8A.

In arrangement 2, bits 1-11 from first 14 bit output obtained from arrangement 1 is retained and bits 12, 13 and 14 are tested using FIGS. 7B and 7F configuration. Bit 1 through bit 6 of 1-11 retained bits are fed to the thermometric decoder 540 and 530. Bits 12, 13 and 14 are tested with capacitors configuration described with reference to FIGS. 7B, 7F and 8B. Newly computed bits 12, 13, 14 and a redundant bit are concatenated with earlier unchanged 1-11 bits to generate second 14 bit digital code in arrangement 2. It may be appreciated that 4 clock cycles are used to generate second 14 bit output.

Figure 8A:
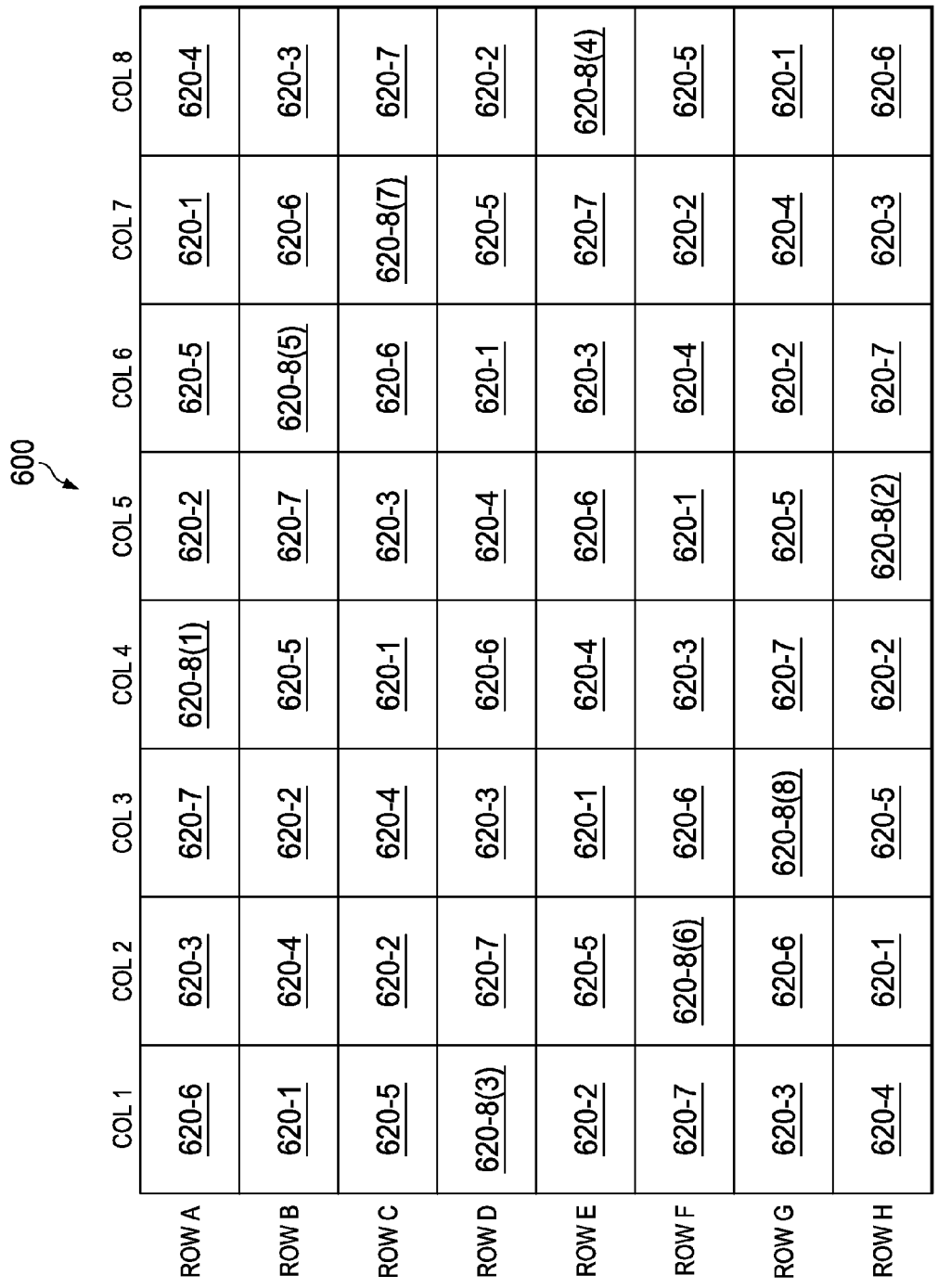
Figure 8B:
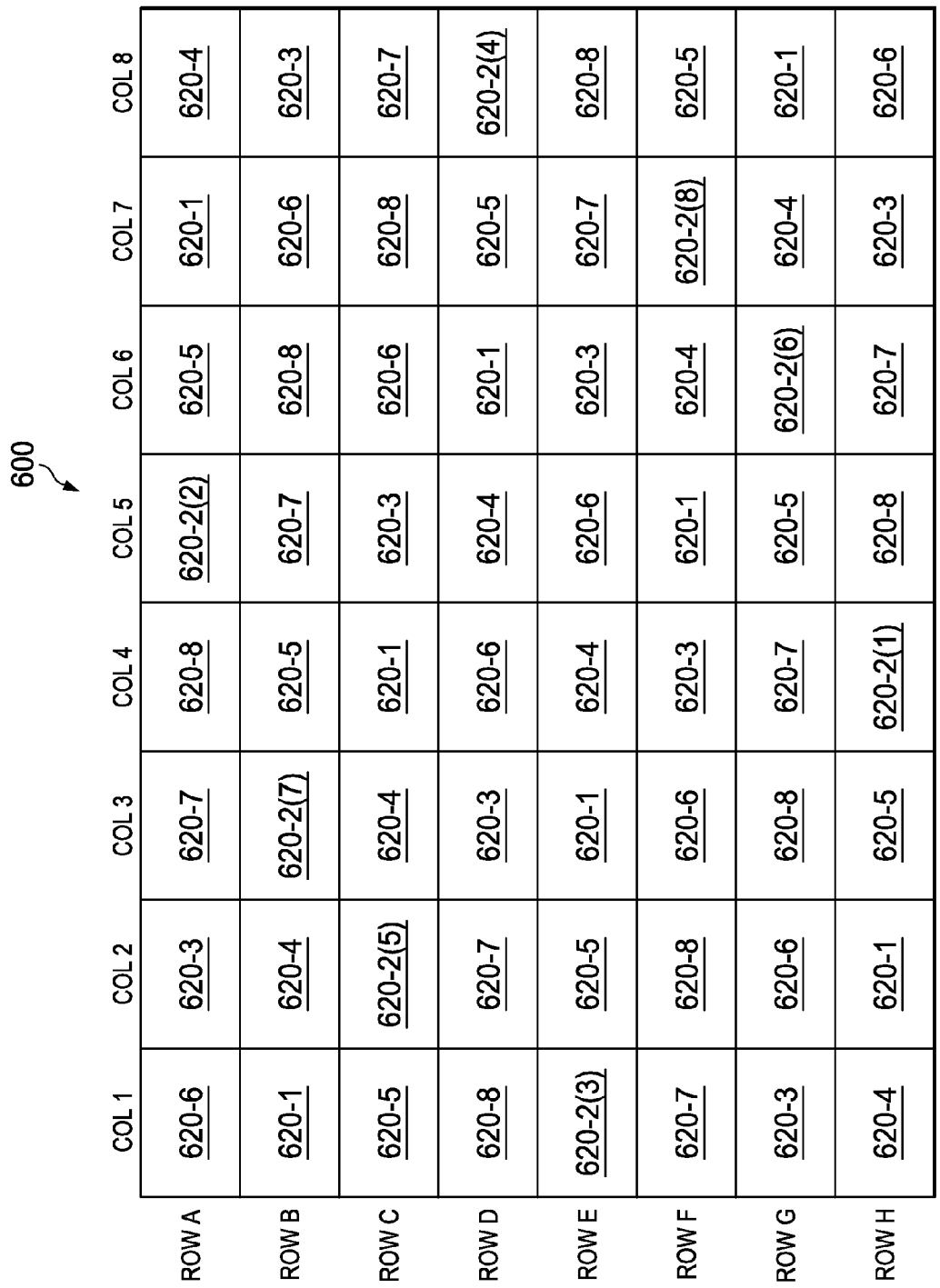
Figure 8C:
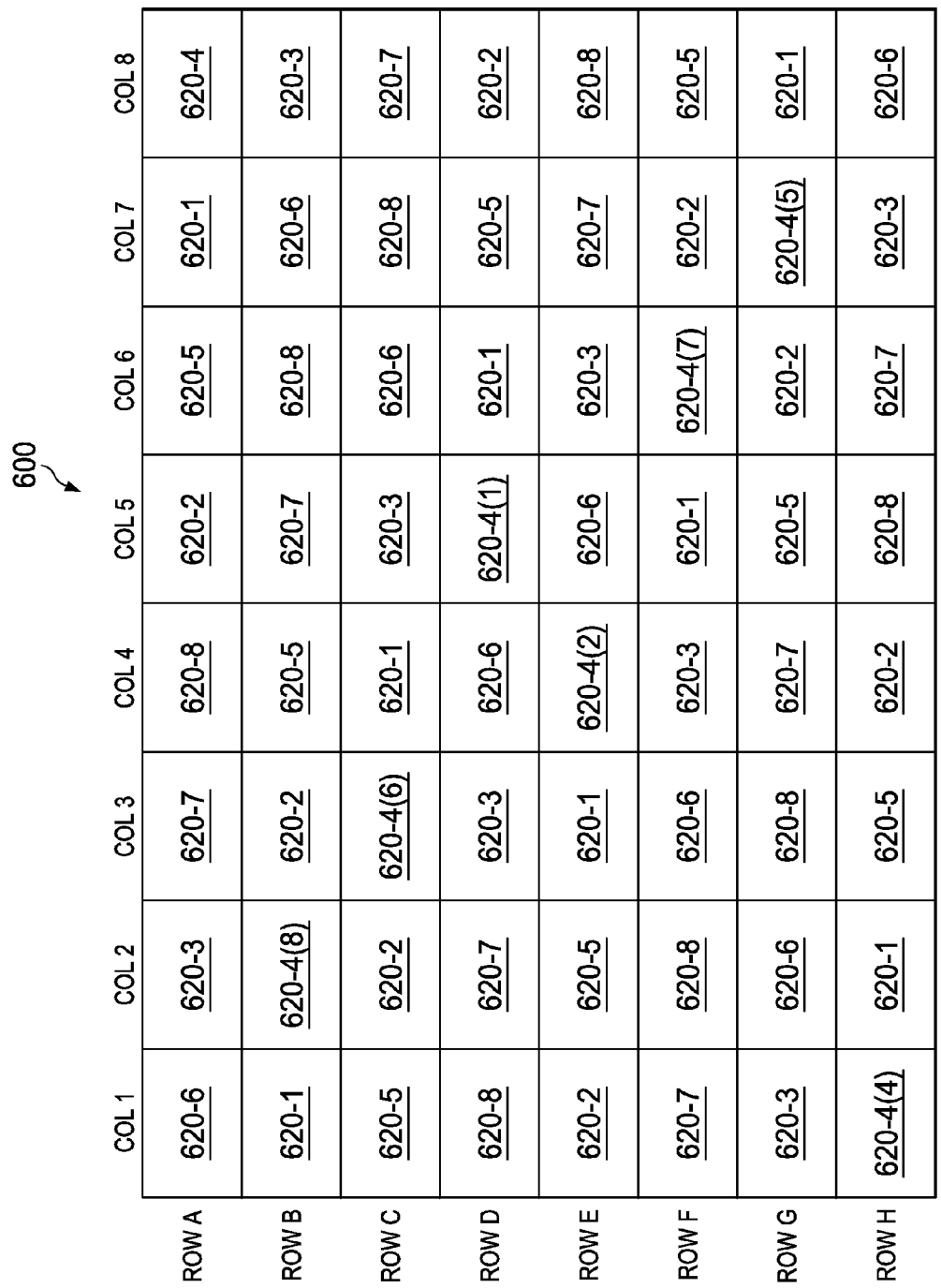

Similarly, in arrangement 3, output of 11 bit obtained from arrangement 1 is retained and bit 12, 13 and 14 are tested using MSB bits configuration described with reference to FIGS. 7C, 7G and 8C. Thus, 4 clock cycles are used to generate third 14 bit output containing earlier unchanged 1-11 bits and newly computed bits 12, 13, 14 and a redundant bit.

Similarly in arrangement 4, output of 11 bit obtained from arrangement 1 is retained and bit 12, 13 and 14 are tested using MSB bits configuration described with reference to FIGS. 7D, 7G and 8D. Thus, 4 clock cycles are used to generate third 14 bit output containing earlier unchanged 1-11 bits and newly computed bits 12, 13, 14 and a redundant bit.

All the four 14 bit digital code output obtained from four arrangements 1, 2, 3, and 4 are averaged and provided as final output of SAR ADC 100. In an alternative example, all four outputs may be added together to generate a 16 bit output. As further alternative, sixteen bit output may be truncated to 14 bit as final output. Thus accuracy of 14 bit SAR ADC is enhanced.

Manner in which resolution of the SAR ADC may be increased in an example is described below with reference to FIG. 10. The graph is described with reference to FIG. 8 illustrating enhancing resolution of SAR ADC from 14 bits to 16 bits.

Figure 10:
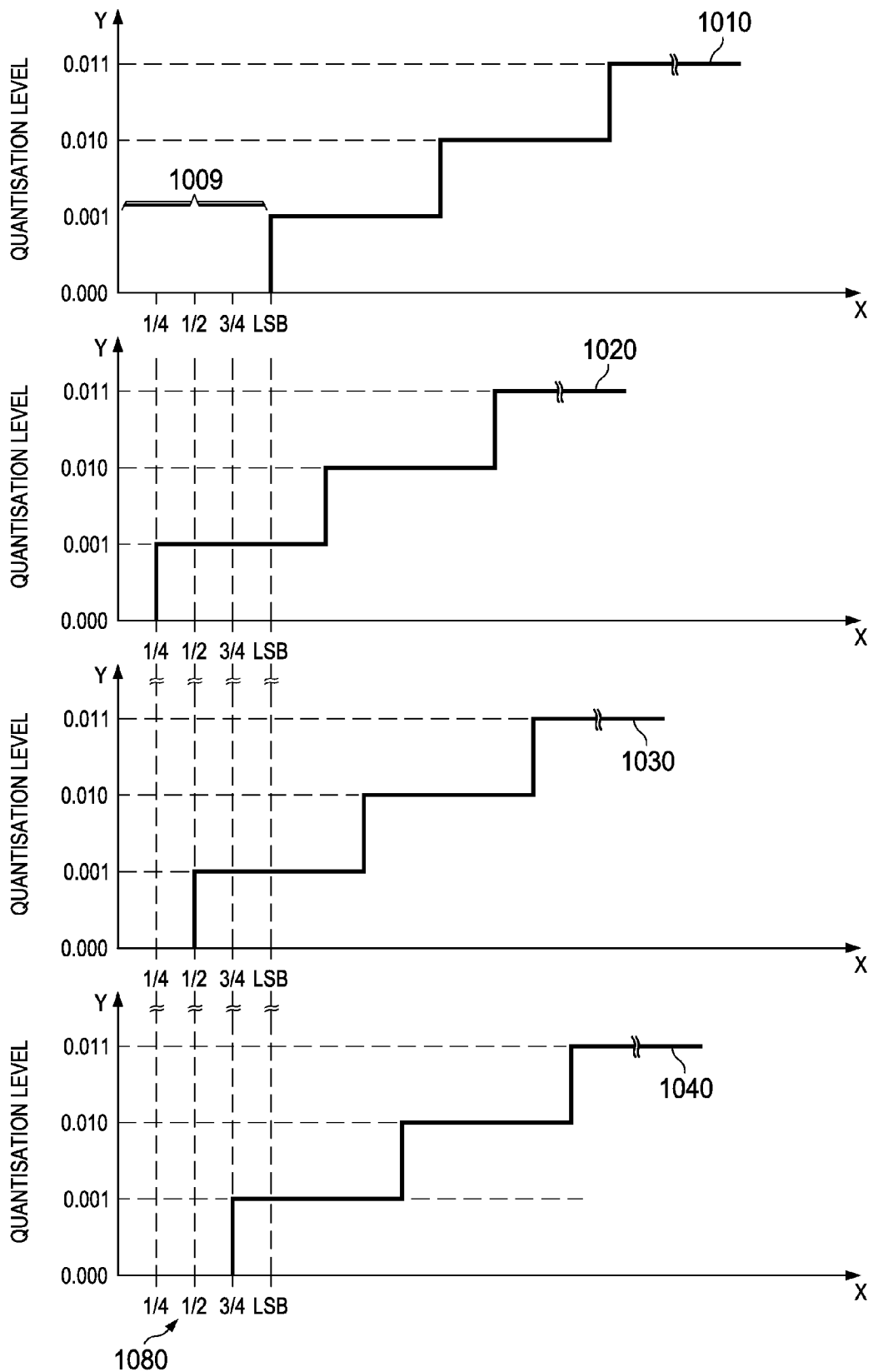
FIG. 10 is a graph depicting transfer function of a SAR ADC of FIG. 1.

FIG. 10 is a graph depicting transfer function of a SAR ADC. The graph is shown containing four transfer functions 1010, 1020, 1030 and 1040. X axis represents the input analog value and Y axis represents the quantisation level (represented by binary value). Thus, one LSB corresponds to length of horizontal segment 1009. As is well known, output code changes by one LSB when input analog signal swings more than LSB 1009. Thus resolution of ADC is determined by the number of quantisation level. For example a 14 Bit SAR ADC will have $2^{14}$ quantisation levels and an LSB of (Full scale Range/$2^{14}$) as well known in the art.

Transfer functions 1010, 1020, 1030 and 1040 are shown shifted (offset) by one LSB, ¼ LSB, ½ LSB and ¾ LSB respectively. Such offset may be achieved dynamically by changing the threshold voltage applied to SAR ADC. Thus, SAR ADC with transfer function 1010 or 1030 or 1040 converts an input analog value 1080 to 0 . . . 000 (all zeros) digital code. Alternatively, SAR ADC operated with transfer function 1020 converts same analog value 1080 into 0 . . . 001 digital code. Thus, analog input with variation of ¼ of LSB is captured in one of the output thereby enhancing the resolution.

In one example, arrangement 1, 2, 3 and 4 described with reference to FIG. 9 above are operated with transfer functions 1010, 1020, 1030 and 1040. The transfer functions 1010-1040 are randomly applied to each arrangement. For example, the first 14 bits output in arrangement 1 may be generated using transfer function 1030, second 14 bits output in arrangement 2 may be generated using transfer function 1010, third 14 bits output in arrangement 3 may be generated using transfer function 1040 and fourth 14 bits output in arrangement 4 may be generated using transfer function 1020. As mentioned above, transfer functions are dynamically changed while in operation by changing the threshold voltage applied to SAR ADC.

The four 14 bit outputs then added to form a 16 bit digital code. Since variation of input signal to ¼ th of the LSB is captured in one of the four outputs, the 16 bit digital code is of 16 bit resolution.

While various examples of the present disclosure have been described above, it should be understood that they have been presented by way of example, and not limitation. Thus, the breadth and scope of the present disclosure should not be limited by any of the above-described examples, but should be defined in accordance with the following claims and their equivalents.

What is claimed is:

1. A method comprising:
   generating an intermediate set of bits;
   converting the intermediate set of bits to a first intermediate analog value from a first set of representative capacitors from a plurality of capacitors in a successive approximation register (SAR) analog-to-digital converter (ADC);
   converting the intermediate set of bits to a second intermediate analog value from a second set of representative capacitors from the plurality of capacitors in the SAR ADC; and
   generating a plurality of digital code bits from the first intermediate analog value and the second intermediate analog value, wherein more than one capacitor in the second set of representative capacitors and the first set of representative capacitors are not same,
   wherein the plurality of capacitor further comprises plurality of capacitor banks of equal capacitance value with each capacitor bank being placed at different location on a semiconductor die and the first set of representative capacitors and the second set of representative capacitor are formed by coupling a set of banks to a reference voltage.

2. The method of claim 1 wherein the second set of representative capacitors are formed by replacing at least one capacitor bank in the first set of representative capacitor with a capacitor bank of same capacitance value at a different location.

3. The method of claim 2 further comprises selecting the first set of representative capacitors and the second set of representative capacitors by a set of thermometric code bits equivalent to the intermediate set of bits.

4. The method of claim 3, further comprises:
   generating a first set of digital output bits from the first intermediate analog value;
   generating a second set of digital output bits from the second intermediate analog value; and
   generating the plurality of digital code bits as average of the first set of digital output bits and the second set of digital output bits.

5. The method of claim 4, wherein generating the plurality of digital code bits further comprises:

generating the first set of digital output bits by comparing the first intermediate analog value and the analog sample;
generating the second set of digital output bits by comparing the second intermediate analog value with the analog sample; and
adding the first set of digital output bits and second set of digital output bits to form a number of digital code bits greater than the number of bits in the first set of digital output or number of bits in second set of digital output due to addition.

6. The method of claim 1, further comprises:
forming a first capacitance ratio by coupling the first set of representative capacitors to one reference value and remaining capacitors in the plurality of capacitors to second reference value; and
forming a second capacitance ratio by coupling the second set of representative capacitors to one reference value and remaining capacitors in the plurality of capacitors to second reference value, wherein the second set of representative capacitors are selected such that error in the first ratio caused by mismatch between one or more capacitors in the first set of representative capacitor is reduced when the first ratio and the second ratio are averaged.

7. An integrated circuit converting an analog sample into plurality of digital code bits comprising:
a two dimension capacitors array physically spread across the integrated circuit;
a digital-to-analog converter (DAC) converting a set of intermediate digital bits to a first intermediate analog value from a first set of representative capacitor from the two dimension capacitor array and converting the set of intermediate digital bits to a second intermediate analog value from a second set of representative capacitor from the two dimension capacitors array;
a comparator comparing the first intermediate analog value with the analog sample and comparing the second intermediate analog value with the analog sample; and
a successive approximation register (SAR) determining the plurality of digital code bits from the results of the comparing,
wherein the two dimension capacitor array comprise plurality of capacitor banks of equal capacitance value with each capacitor bank formed by coupling capacitors at different location in the two dimension array, and the second set of representative capacitor is dynamically formed by changing one or more capacitor banks in the first set of representative capacitors.

8. The integrated circuit of claim 7, further comprising, a thermometric decoder decoding the set of intermediate digital bits into set of thermometric code bits wherein the first set of representative capacitors and second set of representative capacitors are selected from the set of thermometric code.

9. The integrated circuit of claim 8, wherein the first intermediate analog value and second intermediate analog value are sequentially generated at two consecutive clock cycles.

10. The integrated circuit of claim 9, wherein second set of representative capacitor is formed by replacing at least one capacitor bank in the first set of representative capacitor with a capacitor bank having same capacitance value located at different physical location in the two dimension capacitors array.

11. The integrated circuit of claim 7 wherein each capacitor bank comprise at least one capacitor from each row of a two dimension array of unit capacitors.

12. A method of converting an input analog sample into an accurate N bit digital code in a successive approximation register (SAR) analog-to-digital converter (ADC) comprising:
generating first N bits digital code comprising K LSB bits and an N-K MSB bits in N clock cycles using a set of representative capacitors from first physical location in an array of capacitors;
regenerating the K LSB bits in K clock cycle by replacing at least one capacitor in the set of representative capacitors representing N-K MSB bits from a different physical location; and
forming the accurate N bit digital code from the first N bits digital code and the regenerated K LSB bits,
regenerating the K LSB bits multiple times while keeping N-K MSB bits unchanged, wherein each time at least one capacitor in the set of representative capacitor is replaced with a capacitor from a different location; and
averaging multiple regenerated K LSB bits to form the accurate N bit digital code.

13. A method comprising;
operating plurality of times a successive approximation register (SAR) analog-to-digital converter (ADC) with corresponding plurality of transfer functions, each time converting an analog value to plurality of digital codes, wherein the plurality of transfer functions are offset by a fraction of an LSB value; and
adding the plurality of digital codes to form final digital code wherein final digital code is of higher resolution than any of the plurality of digital codes.

14. The method of claim 13, wherein offset between the each transfer the plurality of transfer function is obtained by adjusting a threshold voltage applied to the SAR ADC.

15. The method of claim 14, further comprise:
generating first digital code in the plurality of digital codes; and
generating subsequent one or more digital codes in the plurality of digital code by regenerating a part of the first digital code keeping remaining part same.

16. The method of claim 15, wherein the part of digital code is regenerated by changing at least one capacitor in a set of representative capacitors representing the other part of the first digital code.

17. An successive approximation register (SAR) analog-to-digital converter (ADC) converting an analog sample into plurality of digital code bits comprising:
a two dimension capacitors array physically spread across an integrated circuit, wherein the two dimension capacitor array comprise plurality of capacitor banks of equal capacitance value with each capacitor bank formed by coupling capacitors at different location in the two dimension array, wherein each capacitor bank comprise at least one capacitor from each row of the two dimension array of unit capacitors;
a digital-to-analog converter (DAC) converting a set of intermediate digital bits to a first intermediate analog value from a first set of representative capacitor from the two dimension capacitor array and converting the set of intermediate digital bits to a second intermediate analog value from a second set of representative capacitor dynamically formed by replacing one or more capacitor banks in the first set of representative capacitors in the two dimension capacitors array with a same capacitance value from different physical location, wherein the first intermediate analog value and second intermediate analog value are sequentially converted at two consecutive clock cycles, wherein a thermometric decoder decoding the set of intermediate digital bits into set of thermometric code bits wherein the first set of representative capacitors and second set of representative capacitors are selected from the set of thermometric code;

a comparator comparing the first intermediate analog value with the analog sample and comparing the second intermediate analog value with the analog sample; and a successive approximation register (SAR) determining the plurality of digital code bits from the results of the comparing.

* * * * *